United States Patent [19]

Nemoto

[11] Patent Number: 5,307,318
[45] Date of Patent: Apr. 26, 1994

[54] SEMICONDUCTOR INTEGRATED CIRCUIT DEVICE HAVING MAIN POWER TERMINAL AND BACKUP POWER TERMINAL INDEPENDENTLY OF EACH OTHER

[75] Inventor: Masahisa Nemoto, Tokyo, Japan
[73] Assignee: NEC Corporation, Tokyo, Japan
[21] Appl. No.: 657,768
[22] Filed: Jan. 30, 1991
[30] Foreign Application Priority Data
  Jan. 30, 1990 [JP] Japan .................................. 2-20581
[51] Int. Cl.$^5$ ............................................. G11C 13/00
[52] U.S. Cl. .................................... 365/226; 365/227
[58] Field of Search ............... 365/226, 227, 228, 174, 365/189.01, 189.03, 189.07, 230

[56] References Cited

U.S. PATENT DOCUMENTS 4,288,865 9/1981 Graham .
5,058,075 10/1991 Mizuta ................................. 365/226

FOREIGN PATENT DOCUMENTS 0051533 12/1982 European Pat. Off. .

Primary Examiner—Terrell W. Fears
Attorney, Agent, or Firm—Whitham & Marhoefer

[57] ABSTRACT

A semiconductor integrated circuit device in which an internal circuit thereof is held by a backup power source when a main power source is disconnected comprises a comparator 29 for comparing a potential at a first power terminal 111 with that at a second power terminal 110. When the potential at the first power terminal is reduced switch means 212 connected between the first and second power terminals is closed to supply power from the second power terminal to a data storage unit 17 while forbidding write and read operations of store data.

9 Claims, 5 Drawing Sheets

SEMICONDUCTOR INTEGRATED CIRCUIT DEVICE HAVING MAIN POWER TERMINAL AND BACKUP POWER TERMINAL INDEPENDENTLY OF EACH OTHER

BACKGROUND OF THE INVENTION

The present invention relates to a semiconductor integrated circuit device and, more particularly, to a semiconductor integrated circuit device in which data stored therein internally are required to be held even after a main power voltage is cut off.

In a semiconductor integrated circuit device having a data storage circuit composed of volatile memories such as RAM's, it is frequently required to hold an internal conditions such as data thereof as they are even after a main power supply voltage thereto is removed. For this purpose, it is well-known in the art to use a backup power source for applying a backup voltage to the device which the main power voltage is being removed.

Specifically, as shown in FIG. 5, a main power source 60 which provides a main power or normal operating voltage Vcc is connected through a power switch 61 and a diode 62 to one power terminal 51 of an integrated circuit device (IC) 50 and a backup power source 65 is also connected to the terminal 51 through a diode 66. The other power terminal 52 of IC 50 is grounded (GND). Since a backup voltage $V_{BUP}$ is lower than the normal operating voltage Vcc, when the power switch 61 is turned on to cause IC 50 to perform a normal operation, the diode 66 is reverse-biased to disconnect the backup power source 65 from IC 50. On the other hand, when the switch 61 is turned off to disconnect the main power source 65, the diode 66 becomes conductive and thus the backup voltage $V_{BUP}$ is applied to the power terminal 51. IC 50 is thus brought into a backup condition. The diode 62 is turned off at this time. Thus, the internal states of the integrated circuit device 50 can be held as they are even after the main power source is disconnected.

In such construction as above, however, it is required to provide the diode 66 for disconnecting the backup power source 65 from the power terminal 51 in the normal operation state of IC 50. The increase in number of parts to be mounted externally on the integrated circuit device 50 not only makes a system using IC 50 expensive, but reduces the production yield thereof. Moreover, the backup voltage $V_{BUP}$ is in fact applied to the power terminal 51 with a voltage drop corresponding to the forward voltage drop $V_F$ of the diode 66. For this reason, in order to hold the internal states of IC 50 in the backup condition, it is necessary for the backup power source to generate an actual backup voltage $V_{BUP}$ which is higher than the minimum voltage necessary to hold the internal states of the device at least by the voltage $V_F$. A battery is used as the backup power source 65 in general. The fact that the relatively high backup voltage is required to the battery means that a life time thereof is shortened correspondingly.

SUMMARY OF THE INVENTION

Therefore, an object of the present invention is to provide a semiconductor integrated circuit device in which a backup operation for holding internal states thereof can be performed with the number of externally provided components being reduced.

Another object of the present invention is to provide a semiconductor integrated circuit device in which a backup voltage to be applied thereto can be lowered.

An integrated circuit device according to the present invention comprises a first power terminal to which a main voltage is applied, a second power terminal to which a backup voltage is applied, means for connecting the first power terminal to a source line of an internal circuit, a transistor connected between the second power terminal and the source line of the internal circuit, and compare means for comparing a voltage at the first power terminal with a voltage at the second power terminal to make the transistor non-conductive when the voltage at the first power terminal is larger in absolute value than that at the second power terminal and to make the transistor conductive when the voltage at the first power terminal is smaller in absolute value than that at the second source terminal.

Thus, according to the present invention, a power terminal for a main voltage and a power terminal for a backup voltage are provided separately from and independently of each other, and the transistor is provided between the backup power terminal and the source line of the internal circuit and the conductive states thereof is controlled in accordance to the comparison of voltages at these power terminals. Therefore, it becomes possible to connect the backup power source directly to the second power terminal without using a diode to thereby reduce the number of externally provided parts. In the backup condition, the backup voltage applied to the second power terminal is reduced by an amount corresponding to a voltage drop of the transistor in the conductive state. Since, however, this voltage drop is very small compared with a forward voltage drop of a diode, it is possible to elongate a time for which a backup is carried out correspondingly.

In a preferred embodiment of the present invention, the connecting means comprises a wiring for connecting the first power terminal to the source line of the internal circuit. In this case, it is required to apply the main voltage to the first terminal through a diode to prevent a current from flowing via the transistor into the first power terminal upon backup operation.

According to another preferred embodiment of the present invention, the connecting means includes another transistor connected between the first power terminal and the source line of the internal circuit. This transistor is turned on when the voltage at the first power terminal is higher than that at the second power terminal and turned off when the former is lower than the latter. With such construction, it is possible to directly connect the main power source to the first power terminal, resulting in further reduction in number of externally provided parts and reduction of voltage drop of the main power voltage to be supplied to the internal circuit.

BRIEF DESCRIPTION OF THE DRAWINGS

The above and other objects, advantages and features of the present invention will be more apparent from the following description by taken in conjunction with the accompanying drawings, in which.

DETAILED DESCRIPTION OF THE PREFERRED EMBODIMENTS

Figure 1:
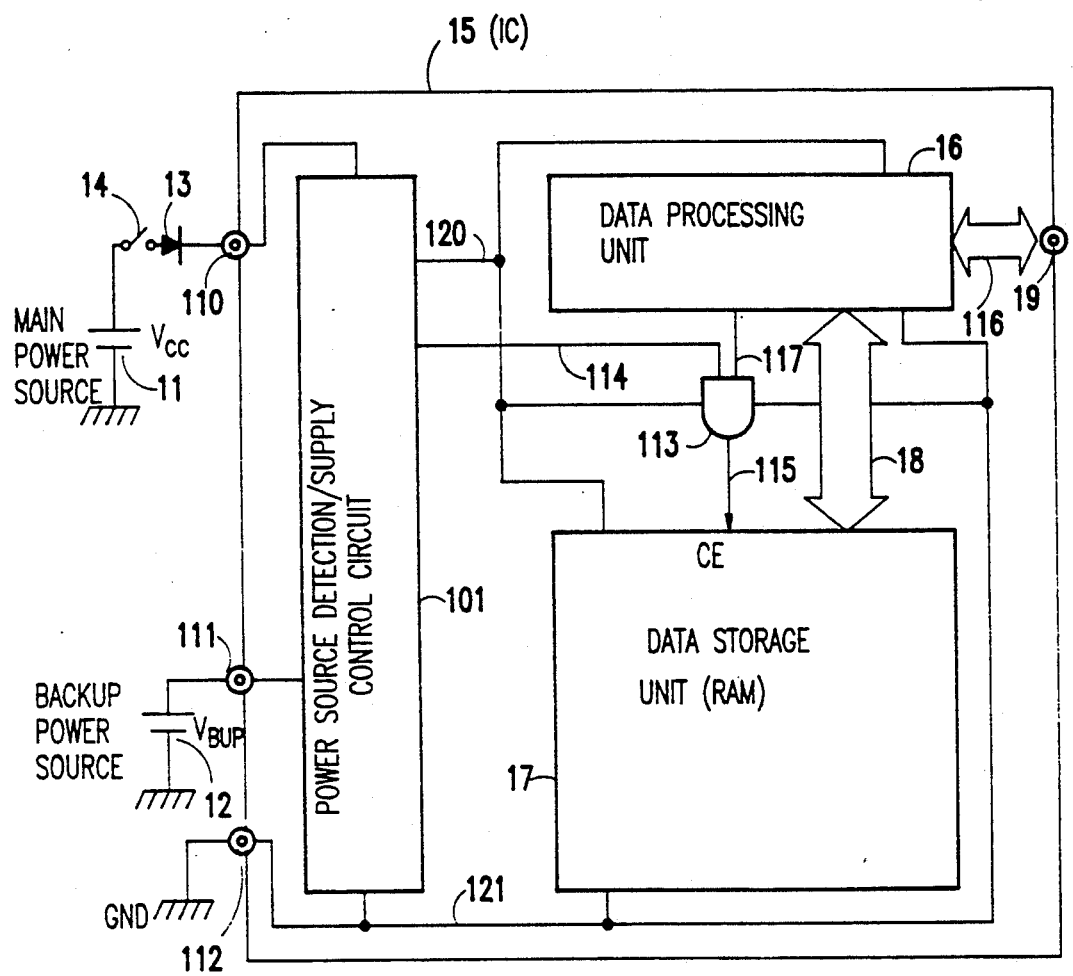
FIG. 1 is an internal block diagram of an IC according to an embodiment of the present invention with a connection of power source to the IC.

Referring to FIG. 1, an integrated circuit device 15 according to an embodiment of the present invention includes a main source terminal 110 as a first power terminal, a backup source terminal 111 as a second power terminal, a ground terminal 112 as a reference power terminal and an input/output terminal 19 for receiving and outputting data and control signals. A main power source 11 for generating a main or an operating voltage Vcc is connected to the main source terminal 110 through a diode 13 and a power switch 14 and a backup power source 12 for generating a backup voltage $V_{BUP}$ is directly connected to the backup source terminal 111. The ground terminal 112 is grounded (GND). The integrated circuit 15 has, as its internal circuit, a data processing circuit 16, an AND gate 113 and a data storage unit (RAM) 17 for storing data to be held even after the main voltage Vcc is removed. These components are activated by a voltage applied between a power source line 120 and a ground line 121. The ground line 121 is connected to the terminal 112. The data processing unit 16 performs predetermined processing operations on data supplied through the input/output terminal 19 and stores resultant data into the unit 17 and/or outputs it externally thereof through the terminal 19. It serves further to read data from the unit 17 and output it externally. The data transfer between the data processing unit 16 and the storage unit 17 is performed through a bus 18. The unit 17 is allowed to output or receive data to or from the unit 16 only when an access signal 115 supplied to a chip enable terminal CE thereof is at an active high level. The access signal 115 is controlled by the AND gate 113 in response to an access request signal 117 from the data processing circuit 16 and an access grant signal 114. Functions of the AND gate 113 will be described later in detail.

The integrated circuit 15 further includes a power source detection/supply control circuit 101 in accordance with the present invention. The circuit 101 is connected to the power terminals 110, 111 and 112 in order to detect the voltage thereat and to control a source voltage to be applied to a source line 120 of the internal circuit. The circuit 101 further controls the access grant signal 114.

Figure 2:
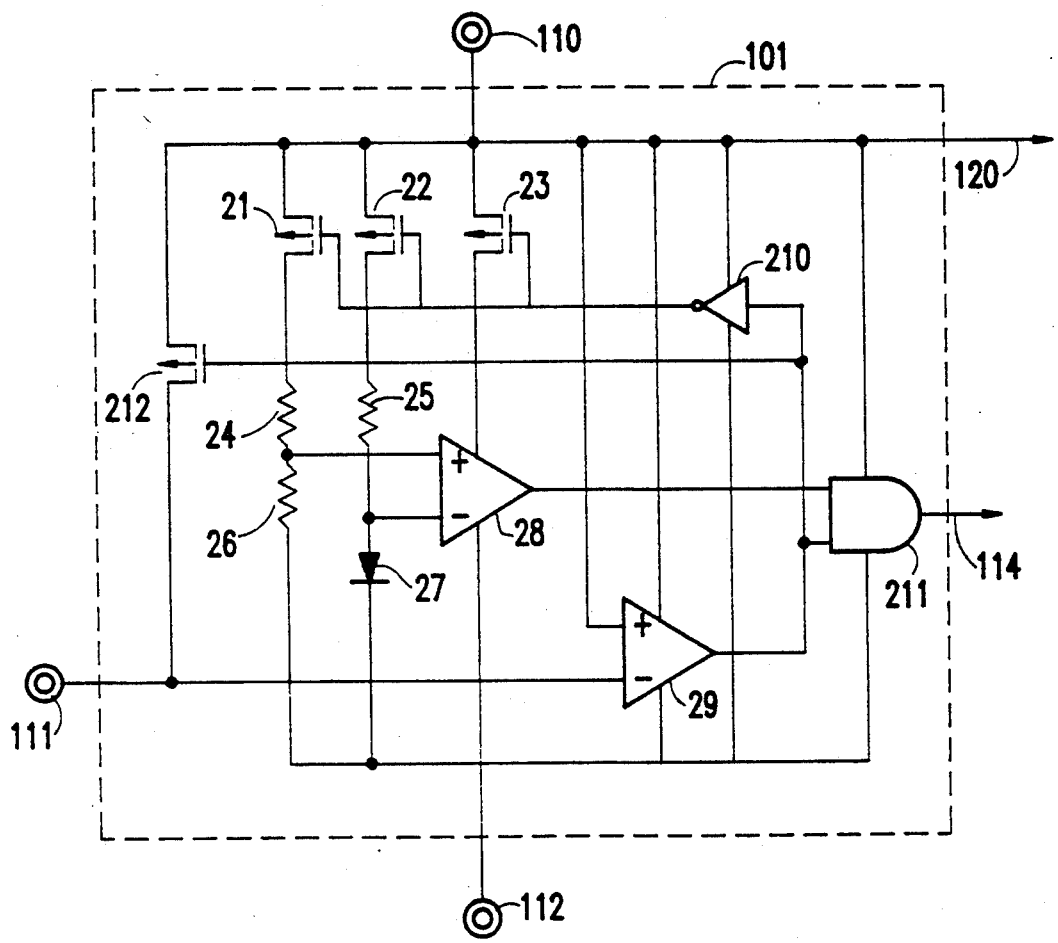
FIG. 2 is a circuit diagram of a power source detection/supply control circuit shown in FIG. 1.

Referring to FIG. 2, the source detection/supply control circuit 101 includes four P-channel MOS transistors 21, 22, 23 and 212, three resistors 24 to 26, a diode 27, a pair of comparators 28 and 29, an AND gate 211 and an inverter 210. In this embodiment, the source line 120 of the internal circuit is connected to the main source terminal 110 through a wiring. Gates of the transistor 21 to 23 are connected in common and their sources are connected in common to the terminal 110. Resistors 24 and 26 are connected in series between a drain of the transistor 21 and the ground terminal 112. The resistor 25 has one end connected to a drain of the transistor 22 and the other end connected to an anode of the diode 27 having a cathode connected to a ground terminal 112. The drain of the transistor 23 is connected to a high potential terminal of the voltage comparator 28. A positive (+) and a negative (−) input of the voltage comparator 28 are connected to a junction between the resistors 24 and 26 and to an anode of the diode 27, respectively. A negative input (−) of the voltage comparator 29 is connected to the terminal 111 and a positive input (+) thereof is connected to the main power terminal 110. An output of the voltage comparator 29 is connected to one input of an AND gate 211 and to the gate of the transistor 212 having a source-drain path connected between the source line 120 and the backup source terminal 111. The transistor 212 operates as a switch. The output of the comparator 29 is further connected to the gates of the transistors 21, 22 and 23 through an inverter 210. The other input of the AND gate 211 is connected to an output of the voltage comparator 28. The comparator 29, the inverter 210 and the AND gate 211 are connected between the main power terminal 110 and the ground terminal 112 to receive an operating voltage. An output of the AND gate 211 is used as the access grant signal 114.

An operation of this integrated circuit device 15 will be described. It will be understood that the main voltage Vcc from the main source 11 is higher than the backup voltage $V_{BUP}$ from the backup source 12.

When the power switch 14 is closed to activate the IC 15, the main voltage Vcc from the main source 11 is supplied through the diode 13 to the power terminal 110. The voltage at the terminal 110 is in turn supplied through the source line 120 to the internal circuit. As a result, the internal circuit performs its predetermined circuit operation. At this time, the output of the comparator 29 is at the high level (Vcc level) and therefore the transistor 212 is in a non-conductive state. Therefore, the backup source 12 is disconnected from the source line 120.

On the other hand, when the power switch 14 is opened to cut out the main source, the voltage of the main power terminal 110 starts to be lowered from Vcc level. In accordance with the decrease of the voltage at the terminal 110, the output voltage of the comparator 29 becomes lower. However, the transistor 212 is maintained in the cut-off state since the gate and source potentials thereof are the same. When the voltage at the terminal 110 becomes equal to the backup voltage $V_{BUP}$, the output of the comparator 29 is changed to the low level (ground potential). At this time, the electrode of the transistor 212 on the side of the backup source terminal 111 operates as a source electrode, and hence the transistor 212 is turned on. Thus, the backup voltage $V_{BUP}$ is supplied through the transistor 212 to the source line 120 of the internal circuit, so that data stored in the data storage unit 17 can be maintained without destruction. Since the transistor 212 produces a voltage drop between the source and the drain thereof during conduction, the output of the comparator 29 is held at the low level. When the power switch is closed again, the transistor 212 is turned off and Vcc is supplied to the line 120.

Thus, no diode is required for connecting the backup source 12 to the IC 15. Since the source-drain voltage of the transistor 212 during conduction is much lower than the forward voltage of the diode, it is possible to extend a time period for which the backing-up is possible.

As mentioned, in this IC 15, the backup voltage $V_{BUP}$ is supplied to the source line 120 during the backing-up period to hold data in the data storage unit 17. At the same time, the voltage $V_{BUP}$ is also supplied to the data processing unit 16 of the internal circuit. Therefore, when signals containing noise happen to be supplied from an external device to the input/output terminal 119, the circuit 16 may produce an access request signal 117 to the data storage unit 17 in response thereto. If the AND gate 113 is absent, the stored data in the data storage unit 17 may be changed, and therefore the object of holding the internal states of the circuit with the backup source during the main source being disconnected could not be achieved.

In order to prevent such situation from occurring, the AND gate 113 and the access grant signal 114 from the source detection/supply control circuit 101 are used. That is, under the backup condition, the comparator 29 outputs a low level so that the AND gate 211 holds the access grant signal 114 at the low level. Therefore, the AND gate 113 maintains the access signal 115 to the unit 17 at low level irrespective of the generation of the access request signal 117 from the data processing circuit 116. Thus, undesired access to the data storage unit 17 during the backup is prevented.

When the IC 15 is in a normal operating condition, the main voltage Vcc may be often lower than the normalized value. If the data processing device 16 operates with such lowered operating voltage, it may produce and store erroneous data in the data storage unit 17. Therefore, it is preferable to prohibit an access to the data storage unit 17 in such situation.

To this end, the comparator 28 is provided. Specifically, a voltage across the diode 27 is applied to an inverted input (−) of the comparator 28. This voltage is stabilized against a variation in voltage at the source terminal 110. On the other hand, applied to a non-inverted input (+) of the comparator 28 is the resistance-divided voltage by the resistors 24 and 26. This voltage varies in accordance with the variation in the voltage at the terminal 10. Therefore, when the voltage at the terminal 110 drops to such a level that causes the resistance-divided voltage become equal to or lower than the voltage across the diode 27, the comparator 28 outputs a low level signal. As a result, the AND gate 211 outputs the low level access grant signal 114 to inhibit an access to the data storage unit 17. Since, as mentioned previously, the AND gate 211 also controls the access grant signal 114 by use of the output of the comparator 29, the resistance values of the resistors 26 and 27 are designed such that the comparator 28 outputs a low level signal when the voltage at the terminal 110 is lowered to a value between its normalized value and the backup voltage $V_{BUP}$. In this embodiment, the comparator 28 outputs the low level signal when the voltage at the terminal 110 is lowered to 4 volts which is an intermediate voltage between the normalized value of 5 volts of the terminal 110 and the backup voltage $V_{BUP}$ of 3 volts.

Thus, the comparator 28, the resistors 24–26 and the diode 27 constitute a main source voltage reduction monitor circuit. The operation of this circuit is not required during the backup period. Therefore, during the backup period, the transistors 21 to 23 are turned off by the high level from the inverter 210, so that no power is consumed in the monitor circuit. The prevention of such power consumption during the backup period may also be realized by providing N-channel transistors on the side of the ground terminal 112, instead of the P-channel transistors 21 to 23, with being supplied with the output of the comparator 29.

Figure 3:
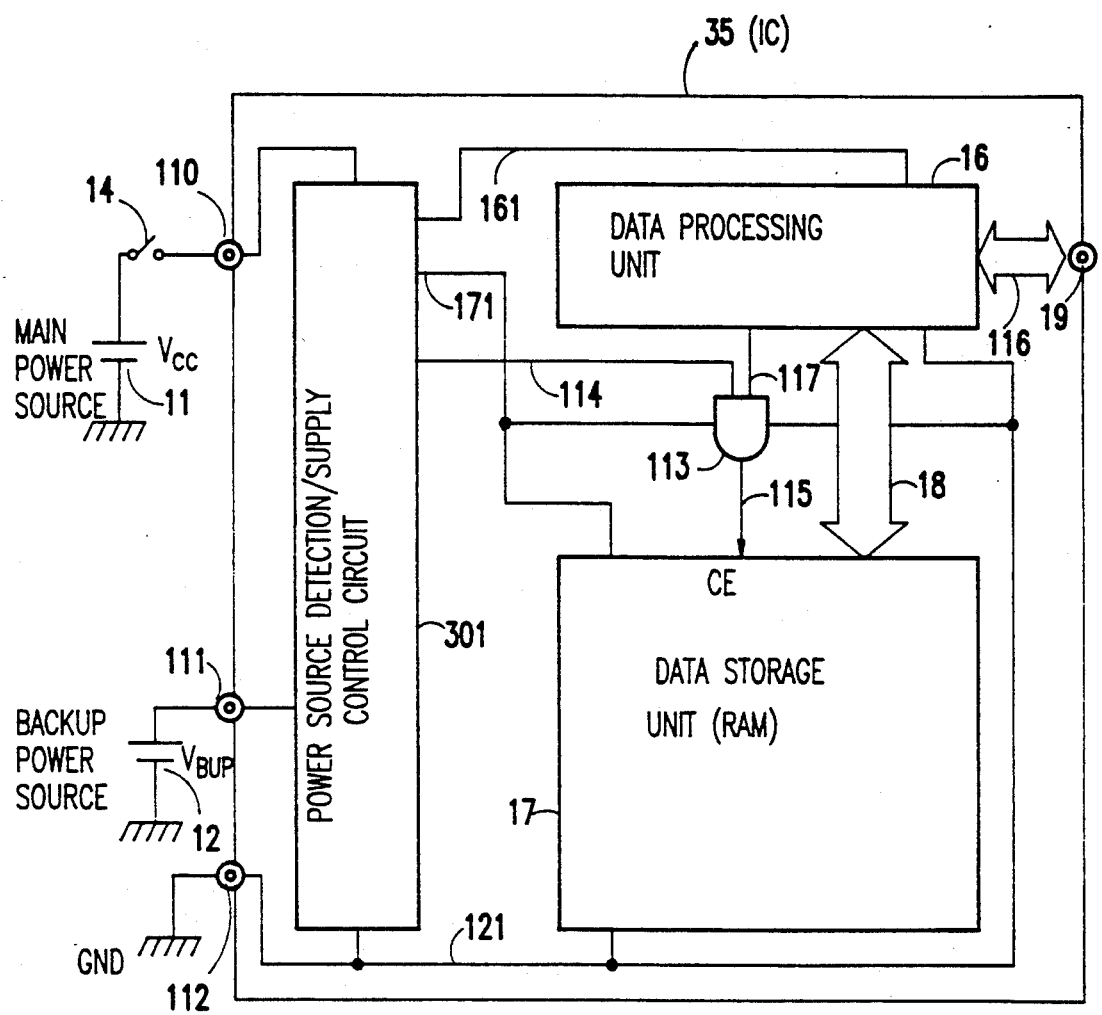
FIG. 3 is an internal block diagram of an IC according to another embodiment of the present invention with a connection of power source to the IC.

Turning to FIG. 3, there is shown an IC 35 according to another embodiment of the present invention, wherein the same constituents as those shown in FIG. 2 are depicted by the same reference numerals to omit the further description thereof. In this embodiment, a power line 161 for a data processing circuit 16 and a power line 171 for a data storage unit 17 and an AND gate 113 are provided independently of each other. The data processing circuit 16 is not required to perform its operation during the backup period, and therefore a source voltage is not required to be applied thereto. Rather, in order to suppress the power consumption of the backup source 12 during the backup, it is preferable to apply no voltage to the unit 16. This embodiment is based on this consideration. The source lines 161 and 171 are connected to a source voltage detection/supply control circuit 301. Moreover, in this embodiment, the diode 13 shown in FIG. 1 is removed for the reason to be described later.

Figure 4:
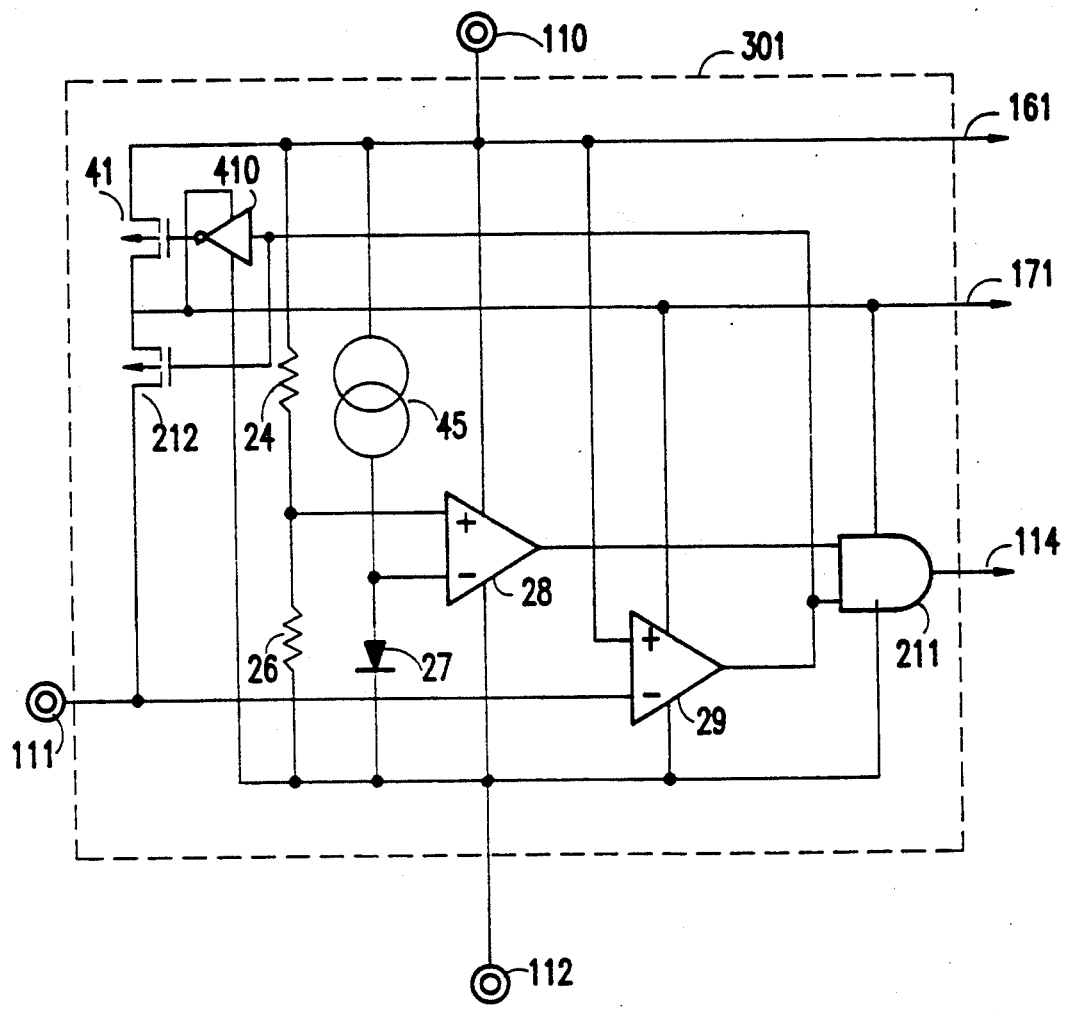
FIG. 4 is a circuit diagram of a power source detection/supply control circuit shown in FIG. 3.
Figure 5:
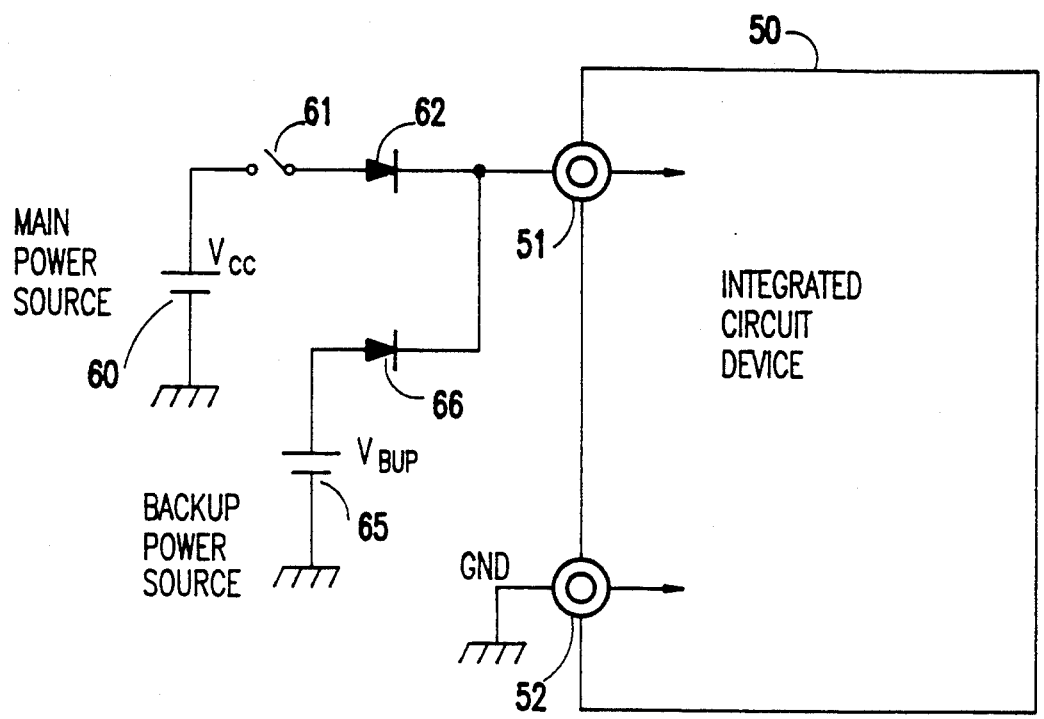
FIG. 5 is a connection diagram of power sources to an IC according to a prior art.

Referring to FIG. 4, the source line 161 for the data processing unit 16 is connected to the main source terminal 110, while the power source line 171 for the data storage unit 17 is connected through a P-channel MOS transistor 41 to the main power terminal 110. Further, an electrode of the transistor 212, which is remote from a backup source terminal 111, is connected to the source line 171. Connected to the gate of the transistor 41 is an output of an inverter 410 which inverts the output of the comparator 29. Furthermore, the transistors 21 to 23 are removed, and in order to enhance the stability of a reference voltage across the diode 27, a constant current source 45 is provided instead of the resistor 25 (FIG. 2).

In a normal operation by closing the power switch 14, the comparator 29 provides the high level output and thus the transistors 41 and 212 are turned on and off, respectively. Therefore, the source lines 161 and 171 receive the main power voltage Vcc and a desired circuit operation is executed. In this case, the voltage at the terminal 10 is monitored by the comparator 28, the resistors 24 and 26, the diode 27 and the constant current source 26 as mentioned previously. Therefore, when the source voltage at the terminal 10 is lowered to a predetermined value, the comparator 28 provides a low level output so that the data storage unit 17 is prevented from being accessed.

When the power switch 14 is opened, the comparator 29 provides the low level output to turn the transistors 41 and 212 off and on, respectively. Therefore, the source line 171 is supplied with the backup voltage $V_{BUP}$, so that the data storage unit 17 holds the stored data. The AND gates 211 and 113 inhibit the access to the unit 17. Due to the transistor 41 being turned off, no current flows from the backup source 12 to the data processing circuit 16 to remove the power consumption therein. Since no current flows into the main power terminal 110, the diode 13 is unnecessary. The main voltage monitor circuit constituted with the components 24 to 28 and 45 also does not consume unnecessary power.

As mentioned, according to this embodiment, the diode 13 on the side of the main source, shown in FIG. 1, becomes unnecessary and, with further reduced power consumption, the life time of the power source 12 can be increased.

In the above embodiments of the present invention, when either one of the comparators 28 and 29 provides the low level output, the AND gate 211 provides the low level access grant signal to inhibit an access to the unit 17. Accordingly, this operation is equivalent functionally to an OR function. Therefore, the AND gate 211 can be replaced with an OR gate by inverting the output of both the comparators 28 and 29. Moreover, since the data storage unit 17 is prevented from being accessed by the comparator 28 before the backup voltage $V_{BUP}$ is supplied to the source lines 120 and 171, the data stored in the unit 17 is free from the destruction which may occur from a time point at which the main source is disconnected to a time point at which the backup voltage is applied becomes more reliable.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention. For example, a schmitt-trigger type comparator can be used for each of the comparators 28 and 29. Moreover, voltage drop means such as a diode may be inserted in series into the non-inverting input and/or the inverting input of the comparator 29.

What is claimed is:

1. A semiconductor integrated circuit device comprising:
   a first power terminal to which a main source voltage is to be applied,
   a second power terminal to which a backup voltage is to be applied,
   a source line for connecting said first power terminal to an internal circuit,
   a transistor connected between said second power terminal and said source line,
   comparator means for comparing a voltage relative to the voltage at said first power terminal with a voltage relative to the voltage at said second power terminal to make said transistor non-conductive when the voltage at said first power terminal is higher in absolute value than a predetermined voltage and to make said transistor conductive when the voltage at said first power terminal is not higher in absolute value than said predetermined voltage,
   data storage means connected to said source line, and
   main source voltage reduction monitor means for inhibiting any data access of said data storage means when the voltage at said first power terminal is lowered to an intermediate value between a regulation voltage and said backup voltage.

2. A semiconductor integrated circuit device as claimed in claim 1, wherein said main source voltage reduction monitor means includes:
   a comparator having an output, an inverted input and a non-inverted input,
   a diode connected between a reference power terminal and said inverted input,
   two resistors connected between said reference power terminal and said non-inverted input and between said non-inverted input and said source line of said internal circuit, respectively, and
   another resistor connected between said inverted input and said source line of said internal circuit.

3. A semiconductor integrated circuit device as claimed in claim 2, further comprising a transistor connected in series between said main source voltage reduction monitor means and said first power terminal and turned off when said voltage at said first power terminal is not higher than said predetermined voltage.

4. A semiconductor integrated circuit device comprising, on a single semiconductor chip, a first power terminal to which a main source voltage is to be applied, a second power terminal to which a backup voltage is to be applied, an internal circuit, a first insulated gate transistor connected between said first power terminal and a source line of said internal circuit, a second insulated gate transistor connected between said second power terminal and said source line of said internal circuit, and comparator means for comparing a voltage relative to the voltage at said first power terminal with a voltage relative to the voltage at said second power terminal to turn said first and second insulated gate transistors ON and OFF, respectively, when the voltage at said first power terminal is larger in absolute value than a predetermined voltage and to turn said first and second insulated gate transistors OFF and ON, respectively, when the voltage at said first power terminal is not larger in absolute value than said predetermined voltage.

5. A semiconductor integrated circuit device comprising:
   a first power terminal to which a main source voltage is to be applied,
   a second power terminal to which a backup voltage is to be applied,
   first switch means connected between said first power terminal and a first source line of an internal circuit,
   second switch means connected between said second power terminal and a second source line of said internal circuit,
   comparator means for comparing a voltage relative to the voltage at said first power terminal with a voltage relative to the voltage at said second power terminal to turn said first and second switch means ON and OFF, respectively, when the voltage at said first power terminal is larger in absolute value than a predetermined voltage and to turn said first and second switch means OFF and ON, respectively, when the voltage at said first power terminal is not larger in absolute magnitude than said predetermined voltage,
   data storage means connected to said second source line, and
   main source voltage reduction monitor means for inhibiting any data access of said data storage means when a voltage relative to the voltage at said first power terminal is lowered to an intermediate value between a regulation voltage and said backup voltage.

6. A semiconductor integrated circuit device as claimed in claim 5, wherein said main source voltage reduction monitor means includes:
   a comparator having an output, an inverted input and a non-inverted input and connected between said reference power terminal and said first power terminal,
   a diode connected between said reference power terminal and said inverted input,
   two resistors connected between said reference power terminal and said non-inverted input and between said first power terminal and said non-inverted input, respectively, and
   a constant current source connected between said inverted input and said first power terminal.

7. A semiconductor integrated circuit device comprising, on a single semiconductor chip, a first power terminal to which a main source voltage is to be applied, a second power terminal to which a backup voltage is to be applied, a first source line for connecting said first power terminal to a first internal circuit, a second source line for a second internal circuit, a first insulated gate transistor connected between said first power terminal and said second source line, a second insulated gate transistor connected between said second power terminal and said second source line, and comparator means for comparing a voltage relative to the voltage at said first power terminal with a voltage relative to the voltage at said second power terminal to turn said first insulated gate transistor ON and said second insulated gate transistor OFF when the voltage at said first power terminal is higher in absolute value than a predetermined voltage and to turn said first insulated gate transistor OFF and said second insulated gate transistor ON when the voltage at the first power terminal is not higher in absolute value than said predetermined voltage.

8. A semiconductor integrated circuit device comprising:
 a first power terminal to which a main source voltage is to be applied,
 a second power terminal to which a backup voltage is to be applied,
 a first source line for connecting said first power terminal to a first internal circuit,
 a second source line for a second internal circuit,
 first switch means connected between said first power terminal and said second source line,
 second switch means connected between said second power terminal and said second source line,
 comparator means for comparing a voltage relative to the voltage at said first power terminal with a voltage relative to the voltage at said second power terminal to turn said first switch means ON and said second switch means OFF when the voltage at said first power terminal is higher in absolute value than a predetermined voltage and to turn said first switch means OFF and said second switch means ON when the voltage at the first power terminal is not higher in absolute value than said predetermined voltage,
 data storage means connected to said second source line, and
 main source voltage reduction monitor means for inhibiting any data access of said data storage means when a voltage relative to the voltage at said first power terminal is lowered to an intermediate value between a regulation voltage and said backup voltage.

9. A semiconductor integrated circuit device as claimed in claim 8, wherein said main source voltage reduction monitor means includes:
 a comparator connected between said reference power terminal and said first source line and having an output, an inverted input and a non-inverted input,
 a diode connected between a reference power terminal and said inverted input,
 two resistors connected between said reference power terminal and said non-inverted input and between said non-inverted input and said second source line, respectively, and
 a constant current source connected between said inverted input and said first source line.

* * * * *